(12) United States Patent
Chang

(10) Patent No.: US 7,023,241 B2
(45) Date of Patent: Apr. 4, 2006

(54) TWO-ENDED VOLTAGE LEVEL SHIFTER FOR TFT LCD GATE DRIVER

(75) Inventor: Kuen-Shan Chang, Hsinchu (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 10/823,538

(22) Filed: Apr. 14, 2004

(65) Prior Publication Data

US 2005/0231238 A1 Oct. 20, 2005

(51) Int. Cl.
*H03K 19/094* (2006.01)
(52) U.S. Cl. .............................. 326/68; 326/63; 326/80; 326/81
(58) Field of Classification Search ................ 326/68, 326/80–81, 62–63; 327/333
See application file for complete search history.

(56) References Cited

U.S. PATENT DOCUMENTS

2002/0190779 A1* 12/2002 Aiba et al. ................ 327/530
2003/0020516 A1* 1/2003 Fujita ........................ 327/63

* cited by examiner

*Primary Examiner*—Anh Q. Tran
(74) *Attorney, Agent, or Firm*—Finnegan, Henderson, Farabow, Garrett & Dunner, L.L.P.

(57) ABSTRACT

A circuit for converting voltage levels that comprises a first power supply providing a first voltage level, a second power supply providing a second voltage level, a first transistor formed between the first and second power supplies including a gate electrode for receiving an input signal including a first state and a second state, a second transistor formed between the first transistor and the second power supply including a gate electrode for receiving a bias voltage, and a current source formed between the second transistor and the second power supply providing a current in response to the first state of the input signal, wherein a voltage level at a node disposed between the second transistor and the current source is pulled to a third voltage level in response to the first state of the input signal, and pulled to the second voltage level in response to the second state of the input signal.

24 Claims, 4 Drawing Sheets

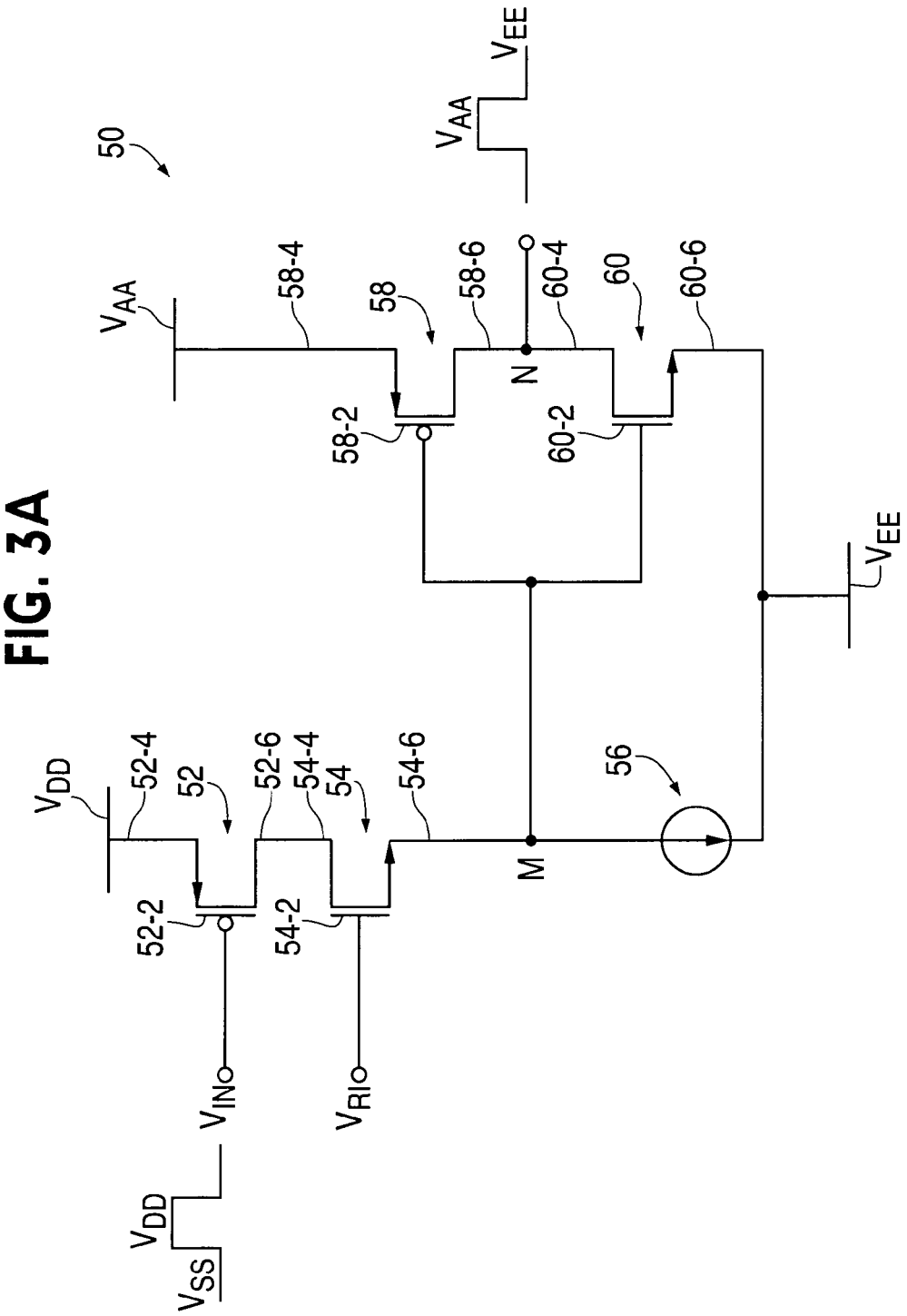

TWO-ENDED VOLTAGE LEVEL SHIFTER FOR TFT LCD GATE DRIVER

DESCRIPTION OF THE INVENTION

1. Field of the Invention

This invention pertains in general to thin film transistor liquid crystal display ("TFT LCD") devices and more particularly, to a two-ended level shifter of a TFT LCD gate driver.

2. Background of the Invention

An active matrix liquid crystal display ("LCD") device generally includes a display panel and a drive circuit to drive the display panel. The drive circuit may further include a gate driver for selecting one row of gate lines and a source driver for providing pixel signals through source lines to pixels corresponding to the selected gate lines. A gate driver, generally operating in a mixed-voltage environment, requires circuits for converting different voltage levels used therein.

FIG. 1A is a block diagram of a gate driver 10 in the art. For a XGA/SXGA display system, gate driver 10 may include 256 output channels OUT1 to OUT 256. Gate driver 10 includes an input level shifter 12, shift registers 14, control units 16, output level shifters 18, and output buffers 20. Input level shifter 12 converts voltage levels of input signals from an LCD control application specific integrated circuit ("ASIC"). The input signals include control signals such as a left/right shift control signal LR, an output enable signal OE and a global-on control signal XON, a clock signal SCLK, and data signals such as right data input/output DIOR and left data input/output DIOL. Shift registers 14 shift start pulses of signals DIOR or DIOL according to signal LR at a rising edge of signal SCLK. Control units 16 decode signals from shift registers 14 and control operation modes of gate driver 10 through signals OE and XON. Output level shifters 18 convert voltage levels of signals from control units 16. The level-converted signals are used to drive a display panel through output buffers 20.

FIG. 1B is a diagram of the different voltage levels used in gate driver 10. The input signals from an LCD control ASIC have a first voltage level ranging from $V_{SS}$ to $V_{DD}$, for example, 0 volt (V) and 3.6V, respectively. To accommodate these input signals to a p-type substrate manufactured in a high-voltage CMOS process, the first voltage level of the input signals needs to be shifted because the p-type substrate is typically connected to a most negative voltage. Input level shifter 12 converts the first voltage level to a second voltage level ranging from $V_{EE}$ to $V_{AA}$, for example, −10V and (−10+(3.6~5))V, respectively. The second voltage level is used in input level shifter 12, shift registers 14 and control units 16. Output level shifters 18 convert the second voltage level to a third voltage level ranging from $V_{EE}$ to $V_{COM}$, for example, −10V and 25V, respectively. The third voltage level is used in output level shifters 18 and output buffers 20.

FIG. 2 is a circuit diagram of an input level shifter 30 in the art. Input level shifter 30 includes a high-voltage p-channel metal-oxide-semiconductor ("PMOS") transistor 32, a high-voltage n-channel metal-oxide-semiconductor ("NMOS") transistor 34, a resistor 36, a low-voltage NMOS transistor 38, a low-voltage PMOS transistor 40, and a low-voltage NMOS transistor 42. High-voltage and low-voltage MOS transistors usually coexist in a mixed-voltage system for processing signals of different voltage levels. A high-voltage MOS transistor is different from a low-voltage MOS transistor in that the high-voltage MOS transistor withstands a higher drain-to-source or gate-to-source voltage than that of the low-voltage MOS transistor. As a result, a high-voltage MOS transistor has a device size greater than that of a low-voltage MOS transistor.

Referring to FIG. 2, high-voltage PMOS transistor 32 includes a gate electrode (not numbered) for receiving an input signal $V_I$ of a voltage level ranging from $V_{SS}$ to $V_{DD}$, and a source electrode (not numbered) coupled to a power supply of $V_{DD}$. High-voltage NMOS transistor 34 includes a gate electrode (not numbered) biased at a reference voltage $V_R$. Low-voltage PMOS transistor 40 includes a gate electrode (not numbered) coupled to a source electrode (not numbered) of high-voltage NMOS transistor 34 and one terminal (not numbered) of resistor 36 at a node A, and a source electrode (not numbered) coupled to a power supply of $V_{AA}$. Low-voltage NMOS transistor 42 includes a gate electrode (not numbered) coupled to a gate electrode (not numbered) and drain electrode of low-voltage NMOS transistor 38 at a node B, and the other terminal (not numbered) of resistor 36. Each of the low-voltage NMOS transistors 38 and 42 includes a source electrode (not numbered) coupled to a power supply of $V_{EE}$. A node C disposed between drain electrodes (not numbered) of low-voltage PMOS transistor 40 and NMOS transistor 42 serves as an output terminal of input level shifter 30.

In the circuit of input level shifter 30, it may be necessary to design resistor 36 with a larger resistance value enough to provide proper voltage levels at nodes A and B in order to turn on or off low-voltage NMOS transistors 40 and 42. As an example, given that a current $I_R$ flowing through resistor 36 is 20 μA, $V_{AA}$ and $V_A$ are each −3.6V, and $V_{EE}$ is −10V, the value of resistor 36 ($R_{36}$) will be as large as approximately 320K ohms (i.e., $R_{36}$=(−3.6V+10V)/20 μA=320K ohms). Resistor 36 of such a large resistance value may disadvantageously result in a significant device size.

SUMMARY OF THE INVENTION

Accordingly, the present invention is directed to a circuit that obviates one or more of the problems due to limitations and disadvantages of the related art.

To achieve these and other advantages, and in accordance with the purpose of the invention as embodied and broadly described, there is provided a circuit for converting voltage levels that comprises a first power supply providing a first voltage level, a second power supply providing a second voltage level, a first transistor formed between the first and second power supplies including a gate electrode for receiving an input signal including a first state and a second state, a second transistor formed between the first transistor and the second power supply including a gate electrode for receiving a bias voltage, and a current source formed between the second transistor and the second power supply providing a current in response to the first state of the input signal, wherein a voltage level at a node disposed between the second transistor and the current source is pulled to a third voltage level in response to the first state of the input signal, and pulled to the second voltage level in response to the second state of the input signal.

Also in accordance with the present invention, there is provided a circuit for converting voltage levels that comprises an input signal having a first voltage level and a second voltage level, a first transistor including a gate electrode for receiving the input signal, a second transistor including a gate electrode for receiving a bias voltage, a current source providing a current in response to the first voltage level of the input signal, and a node disposed between the second transistor and the current source, wherein the second transistor clamps a voltage level at the node between a third voltage level and a fourth voltage level, and wherein the voltage level at the node is approximately the third voltage level in response to the first voltage level of the input signal, and approximately the fourth voltage level in response to the second voltage level.

Still in accordance with the present invention, there is provided a method for converting voltage levels that comprises providing a first power supply of a first voltage level, providing a second power supply of a second voltage level, forming a first transistor between the first and second power supplies including a gate electrode, providing to the gate electrode of the first transistor an input signal including a first state and a second state, forming a second transistor between the first transistor and the second power supply including a gate electrode, providing to the gate electrode of the second transistor a bias voltage, forming a current source between the second transistor and the second power supply providing a current in response to the first state of the input signal, pulling a voltage level at a node disposed between the second transistor and the current source to a third voltage level in response to the first state of the input signal, and pulling the voltage level at the node to the second voltage level in response to the second state of the input signal.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the invention and together with the description, serve to explain the principles of the invention.

BRIEF DESCRIPTION OF THE DRAWINGS

FIG. 3A is a circuit diagram of an input level shifter in accordance with one embodiment of the present invention.

DESCRIPTION OF THE EMBODIMENTS

Figure 1A:
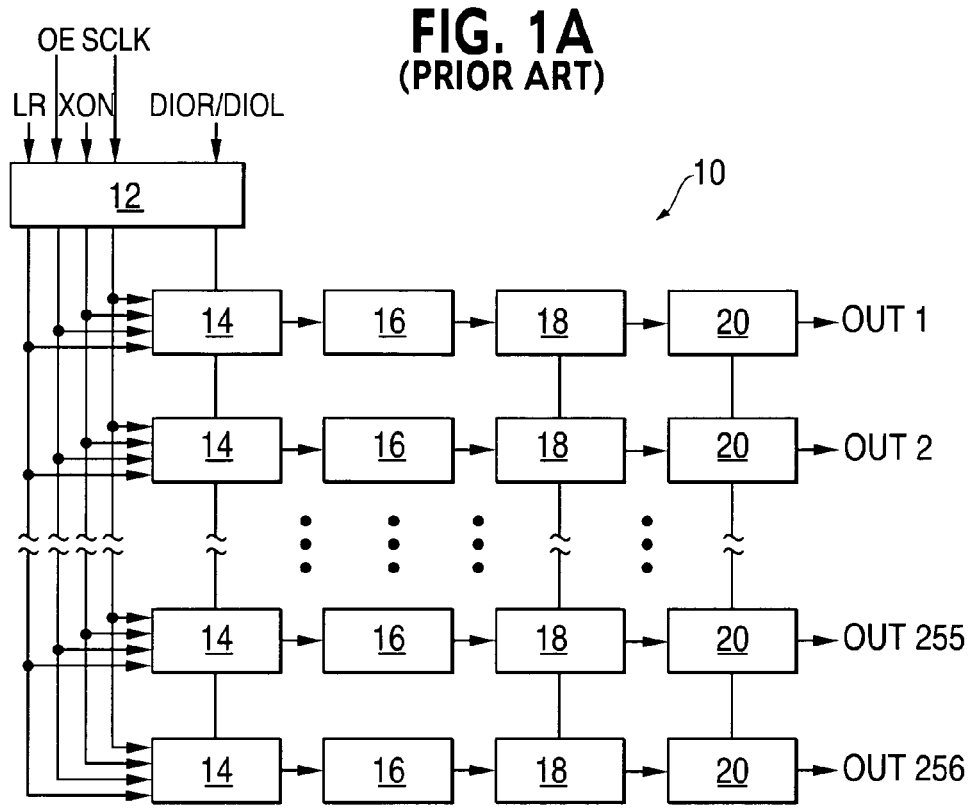
FIG. 1A is a block diagram of a gate driver in the art.
Figure 1B:
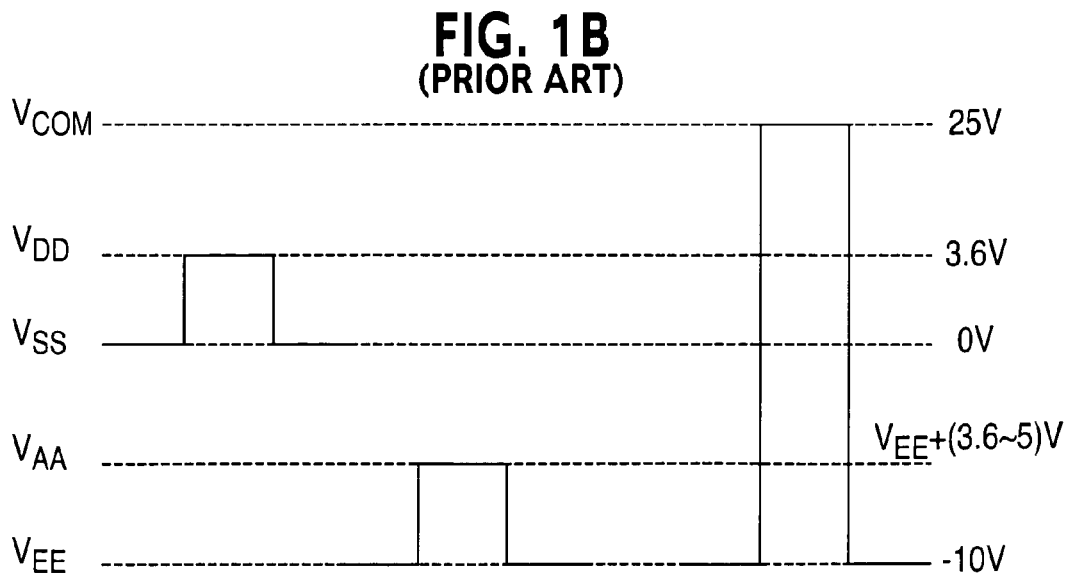
FIG. 1B is a diagram of different voltage levels used in a gate driver in the art.
Figure 2:
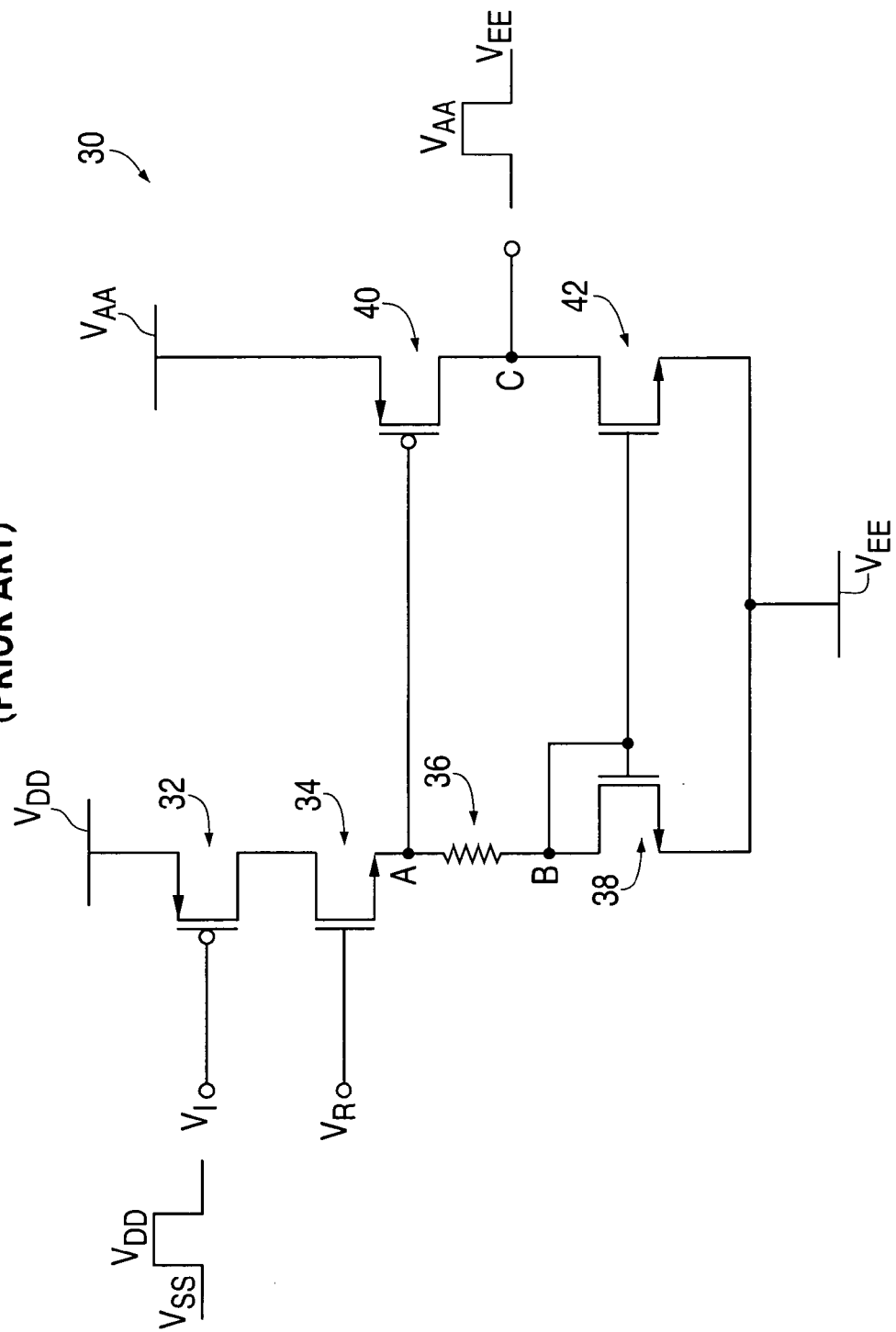
FIG. 2 is a circuit diagram of an input level shifter in the art.

Reference will now be made in detail to the present embodiment of the invention, an example of which is illustrated in the accompanying drawings. Wherever possible, the same reference numbers will be used throughout the drawings to refer to the same or like parts.

FIG. 3A is a circuit diagram of an input level shifter 50 in accordance with one embodiment of the present invention. Input level shifter 50 includes a first transistor 52, a second transistor 54, and a current source 56. In one embodiment according to the present invention, first transistor 52 includes a high-voltage p-channel metal-oxide-semiconductor ("PMOS") transistor, and second transistor 54 includes a high-voltage n-channel metal-oxide-semiconductor ("NMOS") transistor. First transistor 52 includes a gate electrode 52-2, a first electrode 52-4 and a second electrode 52-6. Gate electrode 52-2 receives an input signal $V_{IN}$ including a first state and a second state. In one embodiment, the first state has a voltage level of $V_{SS}$, for example, approximately 0V, and the second state has a voltage level of $V_{DD}$, for example, approximately 3.6V. First electrode 52-4 is coupled to a first power supply providing the voltage level $V_{DD}$. Second transistor 54 includes a gate electrode 54-2, a first electrode 54-4 and a second electrode 54-6. Gate electrode 54-2 is biased at a reference voltage $V_{R1}$. First electrode 54-4 is coupled to second electrode 52-6 of first transistor 52. Second electrode 54-6 is coupled to current source 56. Current source 56 is coupled between second transistor 54 and a second power supply providing a voltage level of $V_{EE}$ of, for example, −10V.

Input level shifter 50 further includes a complementary inverter (not numbered). The complementary inverter includes a third transistor 58 and a fourth transistor 60. In one embodiment according to the present invention, third transistor 58 includes a low-voltage PMOS transistor, and fourth transistor 60 includes a low-voltage NMOS transistor. Third transistor 58 includes a gate electrode 58-2, a first electrode 58-4 and a second electrode 58-6. Gate electrode 58-2 is coupled to a node M disposed between second transistor 54 and current source 56. First electrode 58-4 is coupled to a third power supply providing a voltage level of $V_{AA}$ of, for example, (−10+(3.6~5)) V. Fourth transistor 60 includes a gate electrode 60-2, a first electrode 60-4 and a second electrode 60-6. Gate electrode 60-2 is coupled to node M. First electrode 60-4 is coupled to second electrode 58-6 of third transistor 58. Second electrode 60-6 is coupled to second power supply $V_{EE}$. A node N disposed between third transistor 58 and fourth transistor 60 serves as an output terminal of input level shifter 50.

In response to the first state or $V_{SS}$ of input signal $V_{IN}$, first transistor 52 is turned on, resulting in a current I flowing through first transistor 52, second transistor 54, and current source 56 to second power supply $V_{EE}$. The magnitude of I is predetermined by constant current source 56. Bias voltage $V_{R1}$ applied to gate electrode 54-2 of second transistor 54 has a magnitude predetermined to clamp a voltage level at node M ($V_M$) ranging from approximately $V_{EE}$ to $V_{AA}$ to prevent third transistor 58 and fourth transistor 60 from breakdown. In one embodiment according to the present invention, bias voltage $V_{R1}$ has a voltage level of approximately $V_{AA}$ plus $V_{GS2}$, wherein $V_{GS2}$ is a gate-to-source voltage of second transistor 54. Since first transistor 52 and second transistor 54 are turned on, $V_M$ is pulled to approximately $V_{AA}$, which turns off third transistor 58 and turns on fourth transistor 60. An output voltage at node N ($V_N$) is approximately $V_{EE}$.

In response to the second state or $V_{DD}$ of input signal $V_{IN}$, first transistor 52 is turned off. Since no current flows from first transistor 52, second transistor 54 and current source 56 are turned off. Since first transistor 52 and second transistor 54 are turned off, $V_M$ is pulled to $V_{EE}$, which turns on third transistor 58 and turns off fourth transistor 60. Output voltage $V_N$ is approximately $V_{AA}$. As a result, the voltage level of input signal $V_{IN}$ ranging from $V_{SS}$ to $V_{DD}$ is converted to one ranging from $V_{EE}$ to $V_{AA}$.

Figure 3B:
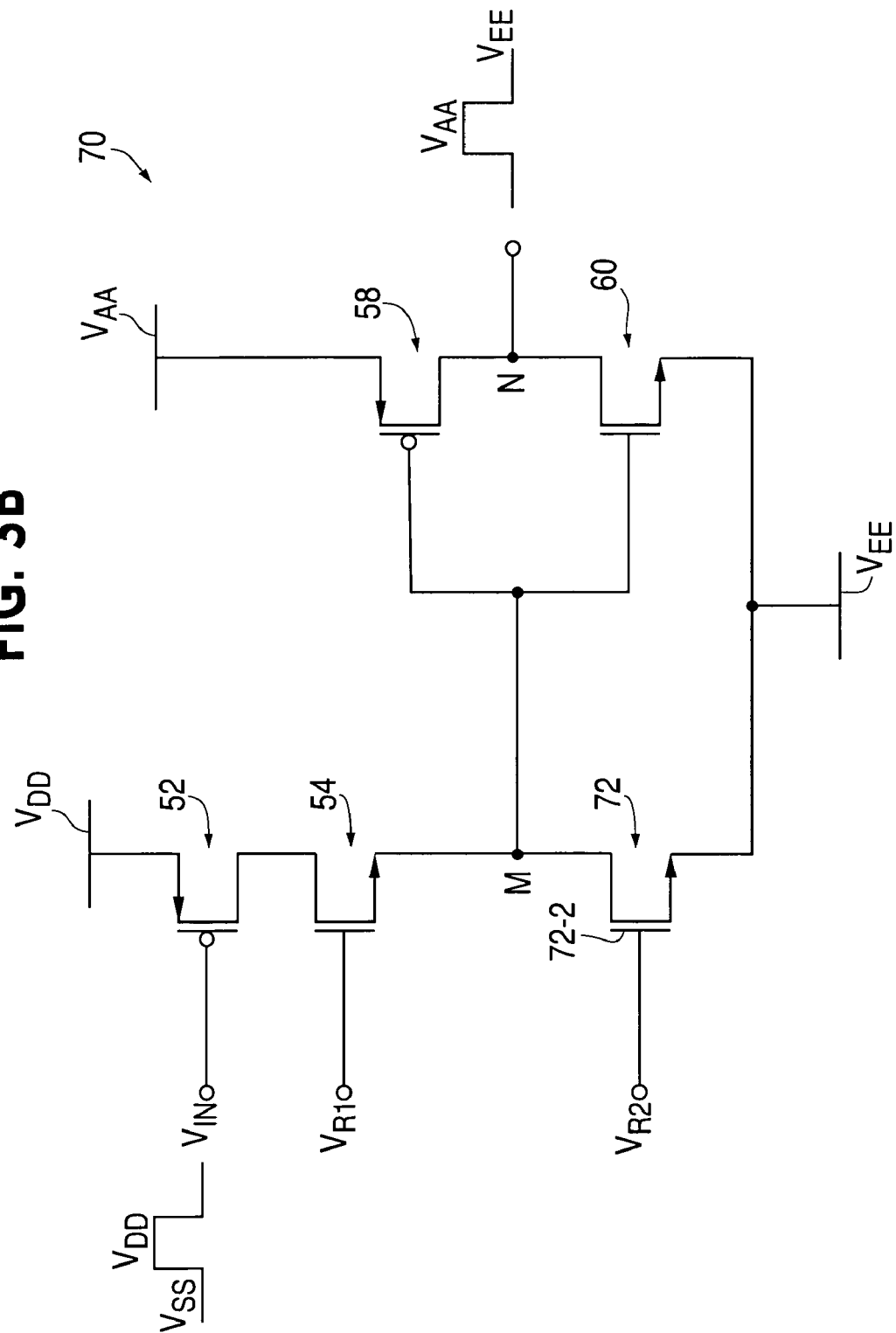
FIG. 3B is a circuit diagram of an input level shifter in accordance with another embodiment of the present invention.

FIG. 3B is a circuit diagram of an input level shifter 70 in accordance with another embodiment of the present invention. Input level shifter 70 is similar to input level shifter 50 shown in FIG. 3A except that a current mirror (not numbered) serves as a current source. The current mirror includes a fifth transistor 72, which is a low-voltage NMOS transistor. Fifth transistor 72 further includes a gate electrode 72-2 coupled to a reference voltage $V_{R2}$. $V_{R2}$ has a magnitude predetermined to ensure that fifth transistor 72 in response to the first state of input signal $V_{IN}$ provides a current I given as follows.

$$I=(\mu C_{OX}/2)(W/L)(V_{GS3}-V_T)^2$$

Where I is a drain current of fifth transistor 72, $\mu$ is the mobility of carriers, $C_{OX}$ is oxide capacitance, W/L is the channel width/length of fifth transistor 72, $V_{GS3}$ is the gate-to-source voltage of fifth transistor 72, and $V_T$ is a threshold voltage of fifth transistor 72.

In response to the first state of input signal $V_{IN}$, first transistor 52, second transistor 54 and fifth transistor 72 are turned on. $V_M$ is approximately $V_{AA}$, which turns off third transistor 58 and turns on fourth transistor 60. Output signal $V_N$ is approximately $V_{EE}$.

In response to the second state of input signal $V_{IN}$, first transistor 52, second transistor 54 and fifth transistor 72 are turned off. $V_M$ is approximately $V_{EE}$, which turns on third transistor 58 and turns off fourth transistor 60. Output signal $V_N$ is approximately $V_{AA}$.

The present invention also provides a method of converting voltage levels. A first power supply of a first voltage level $V_{DD}$ is provided. A second power supply of a second voltage level $V_{EE}$ is provided. A first transistor 52 including a gate electrode 52-2 is formed between first power supply $V_{DD}$ and second power supply $V_{EE}$. An input signal $V_{IN}$ including a first state $V_{SS}$ and a second state $V_{DD}$ is provided to gate electrode 52-2 of first transistor 52. A second transistor 54 including a gate electrode 54-2 is formed between first transistor 52 and second power supply $V_{SS}$. A bias voltage $V_{R1}$ is provided to gate electrode 54-2 of second transistor 54. A current source 56 is formed between second transistor 54 and second power supply $V_{EE}$ to provide a current I in response to the first state of input signal $V_{IN}$. A voltage level $V_M$ at a node M disposed between second transistor 54 and current source 56 is pulled to a third voltage level $V_{AA}$ in response to the first state of input signal $V_{IN}$. Voltage level $V_M$ at node M is pulled to second voltage level $V_{EE}$ in response to the second state of input signal $V_{IN}$.

In one embodiment according to the present invention, voltage level $V_M$ is clamped between second voltage level $V_{EE}$ and third voltage level $V_{AA}$.

The method further comprises providing a complementary inverter. A third transistor 58 is provided including a gate electrode 58-2 coupled to node M. A fourth transistor 60 is provided including a gate electrode 60-2 coupled to node M. A voltage level $V_N$ at an output node N disposed between third transistor 58 and fourth transistor 60 is approximately $V_{EE}$ in response to the first state of input signal $V_{IN}$, and approximately $V_{AA}$ in response to the second state of input signal $V_{IN}$.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A circuit for converting voltage levels comprising:
a first power supply providing a first voltage level;
a second power supply providing a second voltage level;
a third power supply providing a third voltage level;
a first transistor formed between the first and second power supplies including a gate electrode for receiving an input signal including a first state and a second state;
a second transistor formed between the first transistor and the second power supply including a gate electrode for receiving a bias voltage; and
a current source formed between the second transistor and the second power supply providing a current in response to the first state of the input signal;
wherein a voltage level at a node disposed between the second transistor and the current source is pulled to the third voltage level in response to the first state of the input signal, and pulled to the second voltage level in response to the second state of the input signal.

2. The circuit of claim 1, the first and second transistors further comprising high-voltage transistors.

3. The circuit of claim 1, the first transistor further comprising an electrode coupled to the first power supply.

4. The circuit of claim 1, the second transistor further comprising an electrode coupled to the current source.

5. The circuit of claim 1, the bias voltage clamping the voltage level at the node between the second and third voltage levels.

6. The circuit of claim 5, the bias voltage being approximately the third voltage level plus a gate-to-source voltage of the second transistor.

7. The circuit of claim 1 further comprising a complementary inverter coupled between the third power supply and the second power supply.

8. The circuit of claim 7, the complementary inverter further comprising:
a third transistor including a gate electrode coupled to the node; and
a fourth transistor coupled in series with the third transistor including a gate electrode coupled to the node.

9. The circuit of claim 8, the third transistor further comprising an electrode coupled to the third power supply.

10. The circuit of claim 8, the fourth transistor further comprising an electrode coupled to the second power supply.

11. The circuit of claim 8 further comprising a different node disposed between the third and fourth transistors, wherein a voltage level at the different node is pulled to the second voltage level in response to the first state of the input signal, and pulled to the third voltage level in response to the second state of the input signal.

12. A circuit for converting voltage levels comprising:
a first transistor including a gate electrode for receiving an input signal having a first voltage level and a second voltage level;
a second transistor including a gate electrode for receiving a bias voltage;
a current source providing a current in response to the first voltage level of the input signal;
a node disposed between the second transistor and the current source; and
a complementary inverter connectable between a first power supply providing a third voltage level and a second power supply providing a fourth voltage level, the third voltage level and the fourth voltage level being lower than the greater of the first and second voltage levels,
wherein the second transistor clamps a voltage level at the node between the third voltage level and the fourth voltage level; and
wherein the voltage level at the node is approximately the third voltage level in response to the first voltage level of the input signal, and approximately the fourth voltage level in response to the second voltage level.

13. The circuit of claim 12, the first transistor, second transistor and current source being formed between a third power supply providing the second voltage level and the second power supply.

14. The circuit of claim 12, the bias voltage being approximately the third voltage level plus a gate-to-source voltage of the second transistor.

15. The circuit of claim 12, the current source further comprising a current mirror generating the current.

16. The circuit of claim 12, the complementary inverter further comprising a third transistor including a gate electrode coupled to the node, and a fourth transistor including a gate electrode coupled to the node.

17. The circuit of claim 16 further comprising a different node disposed between the third and fourth transistors, wherein a voltage level at the different node is approximately the fourth voltage level in response to the first voltage level of the input signal, and approximately the third voltage level in response to the second voltage level of the input signal.

18. The circuit of claim 12, the first and second transistors including high-voltage transistors.

19. A method for converting voltage levels comprising:
providing a first power supply of a first voltage level;
providing a second power supply of a second voltage level;
providing a third power supply of a third voltage level;
forming a first transistor between the first and second power supplies including a gate electrode;
providing to the gate electrode of the first transistor an input signal including a first state and a second state;
forming a second transistor between the first transistor and the second power supply including a gate electrode;
providing to the gate electrode of the second transistor a bias voltage;
forming a current source between the second transistor and the second power supply providing a current in response to the first state of the input signal;
pulling a voltage level at a node disposed between the second transistor and the current source to the third voltage level in response to the first state of the input signal; and
pulling the voltage level at the node to the second voltage level in response to the second state of the input signal.

20. The method of claim 19 further comprising pulling a different voltage level at a different node disposed between the first transistor and the second transistor in response to the first state and the second state of the input signal.

21. The method of claim 19 further comprising:
providing a third transistor including a gate electrode coupled to the node; and
providing a fourth transistor including a gate electrode coupled to the node.

22. The method of claim 19 wherein the bias voltage clamps the voltage level at the node.

23. The method of claim 19, the bias voltage being approximately the third voltage level plus a gate-to-source voltage of the second transistor.

24. The method of claim 19 further comprising providing a complementary inverter.

* * * * *